United States Patent [19]

Headen, Jr. et al.

[11] Patent Number: 4,721,867
[45] Date of Patent: Jan. 26, 1988

[54] HIGH SPEED LOGIC GATE WITH SIMULATED OPEN COLLECTOR OUTPUT

[75] Inventors: William E. Headen, Jr.; Stephen S. Yole, both of West Warwick, R.I.

[73] Assignee: Cherry Semiconductor Corporation, East Greenwich, R.I.

[21] Appl. No.: 852,833

[22] Filed: Apr. 16, 1986

[51] Int. Cl.[4] .................. H03K 19/088; H03K 19/084; H03K 19/00; H03K 3/01

[52] U.S. Cl. .................... 307/456; 307/458; 307/473; 307/270; 307/280

[58] Field of Search ........ 307/473, 280, 302, 456–458, 307/446, 270

[56] References Cited

U.S. PATENT DOCUMENTS 3,217,181 11/1965 Zuk ..................................... 307/456
3,348,162 10/1967 Atkins .................................. 307/254
4,581,550 4/1986 Ferris et al. .......................... 307/473

OTHER PUBLICATIONS

The TTL Data Book for Design Engineers, Texas Instruments, 1976, pp. 6–27.
The Linear and Interface Circuits Data Book for Design Engineers, Texas Instruments, 1973, pp. 8–95.

Primary Examiner—John S. Heyman
Assistant Examiner—M. R. Wambach
Attorney, Agent, or Firm—Robert M. Asher

[57] ABSTRACT

A high speed logic gate is disclosed in which the voltage across the output transistor is clamped by a diode, a current switch transistor, a resistor connected between the diode and the transistor and a resistor connected to ground. A selectable high impedance is provided to enable the output of the logic gate to simulate an open collector output.

2 Claims, 1 Drawing Figure

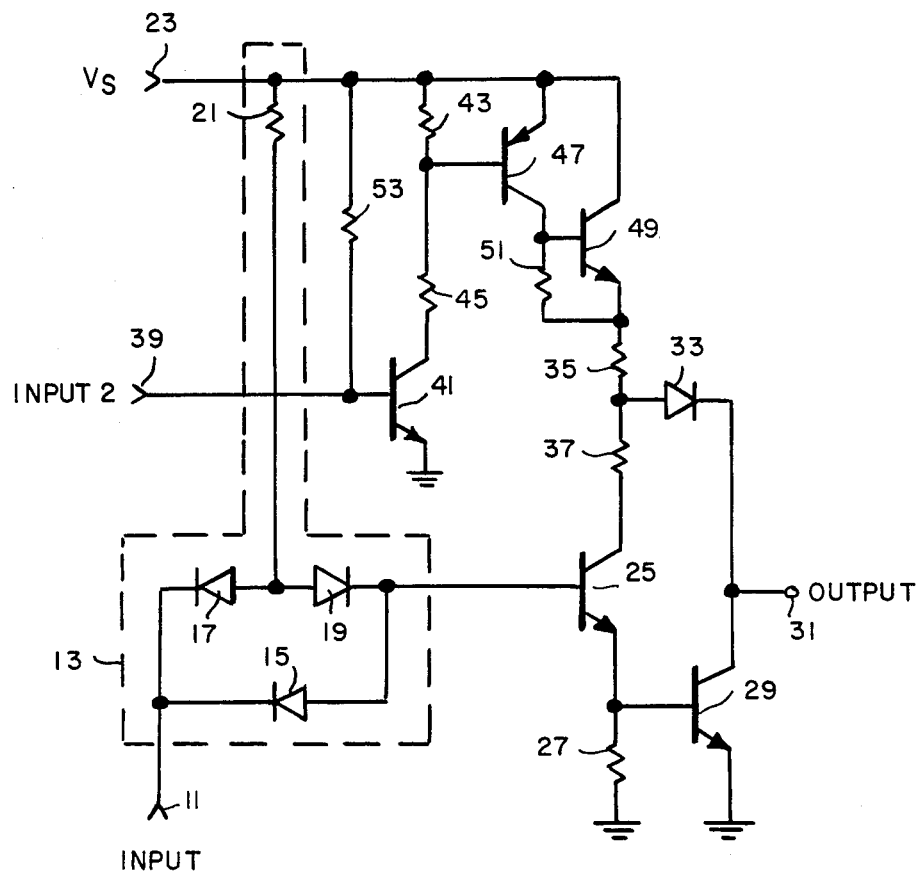

HIGH SPEED LOGIC GATE WITH SIMULATED OPEN COLLECTOR OUTPUT

BACKGROUND OF THE INVENTION

This invention relates to an integrated circuit providing a high-speed logic gate without the need for Schottky diodes or gold doping and a selectable high impedance output to simulate an open collector.

The use of Schottky diodes requires an extra processing step in the manufacture of an integrated circuit. Gold doping as used in present TTL and LSTTL products is a relatively costly procedure requiring capital equipment not readily available to all integrated circuit manufacturers. TTL and LSTTL devices provide high-speed propagation of pulses. It is an objective of the present invention to obtain high-speed circuitry that can be made without the use cf Schottky diodes or gold doping.

Many applications for integrated circuits require open collector outputs. It is therefore advantageous where an open collector is not provided to have some means of simulating the open collector output.

SUMMARY OF THE INVENTION

The logic gate of the present invention has a first input connected to a threshold setting circuit which sets the points at which a switch between a high and a low signal are recognized. The threshold setting circuit is connected to the base of a current switch transistor. The emitter of the current switch transistor is connected to the base of the output transistor and to a resistor connected to ground. The cathode of a diode is connected to the collector of the output transistor. A resistor is connected between the anode of the diode and the collector of the current switch transistor. A current limiting resistor is connected between the source voltage and the anode of the diode. A switchable high impedance is connected between the end of the voltage divider and the source voltage.

The diode advantageously clamps the voltage across the output transistor at a minimum which will prevent the output transistor from saturating. It is a further advantage of the circuit of the present invention that a high impedance may be switched on so that the circuit can simulate an open collector output.

Other objects and advantages will become apparent during the following description of the presently preferred embodiment of the invention taken in conjunction with the drawing.

BRIEF DESCRIPTION OF THE DRAWINGS

The figure is a schematic diagram of the circuit of the present invention.

DETAILED DESCRIPTION OF THE PREFERRED EMBODIMENT

Referring now to the drawing, the circuit of the present invention is shown. A first logic input 11 connects to a threshold setting circuit 13. Threshold setting circuits of this type are well known in the art. The embodiment of the threshold setting circuit 13 shown includes back biased diodes 15 and 17 and a forward biased diode 19. The diode 17 and diode 19 are connected in series. The series connection of the diodes 17 and 19 are connected in parallel with diode 15. A resistor 21 is connected at one end between diode 17 and 19. The resistor 21 is connected at its other end to a source voltage 23. The threshold setting circuit 13 determines when the signal at input 11 has changed from a low signal to a high signal or vice versa.

When input 11 trips the high threshold, current flowing through resistor 21 is directed through diode 19 and is supplied to the base of a current switch transistor 25. The current flows through the emitter of current switch transistor 2 into a resistor 27 and the base of the output transistor 29. Thus, when the first input 11 is high the current from resistor 21 turns on transistor 25 and transistor 29. The emitter of transistor 29 is connected to ground thereby providing a low at the output 31, when output transistor 29 is on.

In order to prevent the output transistor 29 from saturating, a diode clamp is provided. The diode clamp includes a diode 33 whose cathode is connected to the collector of the output transistor 29. A resistor 37 connects between the anode of the diode 33 and the collector of the current switch transistor 25. A current limiting resistor 35 is connected to the anode of the diode 33 and is coupled to the source voltage at its other end. In accordance with the presently preferred embodiment of the present invention, resistor 27 is 500 ohms, current limiting resistor 35 is 730 ohms, resistor 37 is 40 ohms, and resistor 21 is 5 K ohms. The output transistor 29 must be large enough so that its bulk resistance is low enough to prevent itself from saturating.

In the presently preferred embodiment, an off or low voltage is typically 270 millivolts. Whereas a high output voltage would be roughly equivalent to the source voltage 23.

In accordance with the circuit of the present invention, when the output is low, the voltage at the collector of the output transistor 29 is determined by the sum of the base-emitter voltage of the output transistor 29 plus the saturation voltage across the current switch transistor 25 plus the voltage across resistor 37 minus the voltage across diode 33. The voltage across resistor 37 is determined approximately by multiplying the resistance of resistor 37 by the base-emitter voltage of the output transistor 29 divided by the resistance of resistor 27. With the circuit of the present invention, propagation of a pulse from input 11 to output 31 is possible in less than 100 nanoseconds. The speed of the circuit would be severely hampered if the output transistor were ever allowed to saturate.

If the first input 11 is low, current switch transistor 25 is turned off. Thus output transistor 29 is off and the output will be high so long as this logic gate has been selected as indicated by a high signal or open circuit at a second input 39. When this logic gate is selected, transistor 49 is on and the cutput signal will equal approximately the source voltage 23 minus the saturation voltage across transistor 49. The logic gate of the embodiment shown in the figure is an invertor.

A high impedance circuit is switched on or off through the second input 39. The second input 39 is provided as a selection input. For example, if the present circuit is used to take data off of a floppy disc drive it may be wire ORed with a number of other identical circuits for taking information off of other floppy disc drives. When the disc drive associated with this invertor is selected for providing data, the second input 39 is opened or set at a high signal. When the second input 39 is at a high, a transistor 41 is turned on. Thus, current flows through resistors 43 and 45. This turns on transistor 47 which turns on transistor 49. With transistor 49 on, the voltage at the end of the voltage divider coupled to the source voltage is equal to about the source voltage minus the saturation voltage of transistor 47 minus the base-emitter voltage of transistor 49. If the first input 11 is low, current switch transistor 25 and output transistor 29 would be off. If the output 31 were grounded, current would flow across resistor 35 and through diode 33 into the external circuitry. This would be highly undesirable if a number of these circuits were connected in a wired OR configuration and only one circuit was delivering data. In the presently preferred embodiment, resistor 43 and resistor 45 are 10K resistors.

In accordance with the present invention, when this particular circuit is not selected for propagating data, the second input 39 is grounded. Current from the source voltage would flow through a resistor 53. Transistor 41 would be off. Thus, no current would flow through resistors 43 and 45 turning off transistor 47. This would turn off transistor 49. A resistor 51 is provided between the base of transistor 49 and its emitter. The off transistors 47 and 49 effectively disconnect the output 31 from the source voltage 23. If the output 31 were grounded, essentially no current would flow from the source voltage 23 into the external circuitry. In this state, with the second input 39 low, external circuitry at output 31 sees essentially an open circuit. Actually, it is faced with a high impedance formed by the impedance of transistor 49 in its off state. As such, an open collector output is simulated. In the presently preferred embodiment, resistor 53 is 20K ohms, and resistor 51 is 10K ohms.

To summarize the operation of the present circuit, when the second input 39 is selected by an open or high signal, then the circuit operates as a high speed invertor of data being propagated between the first input 11 and the output 31. When the second input 39 is not selected as indicated by a low or grounded input, the output 31 simulates an open collector.

Of course, it should be understood that various changes and modifications to the preferred embodiments described above will be apparent to those skilled in the art. For example, other known threshold setting circuits may be substituted for the one disclosed herein. These and other changes can be made without departing from the spirit and the scope of the invention and without diminishing its attendant advantages. It is therefore intended that such changes and modifications be covered by the following claims:

We claim:

1. A logic gate comprising:
   an input for receiving a high or low signal;
   threshold setting means for determining when the signal from said input has changed;
   a current switch transistor having a base, a collector and an emitter, the base of said transistor being connected to said threshold setting means;
   an output transistor having a collector, an emitter connected to ground and a base connected to the emitter of said current switch transistor;
   a resistor connected between the emitter of said current switch transistor and ground;
   a diode having an anode and a cathode, the cathode being connected to the collector of said output transistor;
   a resistor connected between the anode of said diode and the collector of said current switch transistor;
   a source voltage input for receiving a source voltage;
   a current limiting resistor connected at one end to the anode of said diode and having an other end;
   a logic gate output connected to the collector of said output transistor;
   a second input for receiving a high or low signal;
   a switching transistor having a collector, an emitter connected to ground and a base connectd to said second input;
   resistor means for limiting the current through said switching transistor, said resistor means connected between said source voltage and the collector of said switching transistor;
   a first transistor having a base connected to said resistor means and an emitter connected to said source voltage; and
   a second transistor having a base connected to the collector of said first transistor, an emitter connected to the other end of said current limiting resistor and a collector connected to said source voltage.

2. The logic gate of claim 1 wherein said resistor means comprises two resistors connected in series such that the base of said first transistor is connected between said two resistors.

* * * * *

UNITED STATES PATENT AND TRADEMARK OFFICE
CERTIFICATE OF CORRECTION

PATENT NO. : 4,721,867

DATED : January 26, 1988

INVENTOR(S) : Headen, Jr. et al.

It is certified that error appears in the above-identified patent and that said Letters Patent is hereby corrected as shown below:

At column 2, line 8, please delete "2" and substitute --25--.

At column 2, line 53, please delete "cutput" and substitute --output--.

Signed and Sealed this

Eleventh Day of September, 1990

Attest:

HARRY F. MANBECK, JR.

*Attesting Officer*      *Commissioner of Patents and Trademarks*